United States Patent [19]

Morozumi

[11] Patent Number: 4,862,237
[45] Date of Patent: Aug. 29, 1989

[54] SOLID STATE IMAGE SENSOR

[75] Inventor: Shinji Morozumi, Suwa, Japan

[73] Assignee: Seiko Epson Corporation, Tokyo, Japan

[21] Appl. No.: 253,917

[22] Filed: Oct. 4, 1988

Related U.S. Application Data

[63] Continuation of Ser. No. 96,279, Sep. 10, 1987, abandoned, which is a continuation of Ser. No. 569,641, Jan. 10, 1984, abandoned.

[30] Foreign Application Priority Data

Jan. 10, 1983 [JP] Japan .................................. 58-2080
Sep. 20, 1983 [JP] Japan .............................. 58-173362

[51] Int. Cl.⁴ ............................................. H01L 27/14
[52] U.S. Cl. ..................................... 357/30; 357/23.7; 357/41; 357/42
[58] Field of Search ................... 357/23.7, 30 I, 30 K, 357/41, 42

[56] References Cited

U.S. PATENT DOCUMENTS

| 3,191,061 | 6/1965 | Weimer | 357/23.7 |
| 3,339,075 | 8/1967 | Szepesi | 357/30 |
| 4,223,330 | 9/1980 | Koike | 357/31 X |
| 4,323,912 | 4/1982 | Koike et al. | 357/30 |
| 4,472,821 | 9/1984 | Mazin | 377/79 |

FOREIGN PATENT DOCUMENTS 2512373A 11/1975 Fed. Rep. of Germany ..... 357/23.7
58-67068A 4/1983 Japan .................................. 357/23.7

Primary Examiner—Martin H. Edlow
Attorney, Agent, or Firm—Blum Kaplan

[57] ABSTRACT

A solid state image sensor including a plurality of sensing cells, each formed of a switching transistor and a thin film sensing device, arranged in a line or a matrix. The switching transistor is a thin film transistor (TFT) of polycrystalline silicon and the thin film sensing device utilizes a layer of amorphous silicon formed on a lower electrode which is electrically connected to the drain of the switching.

18 Claims, 10 Drawing Sheets

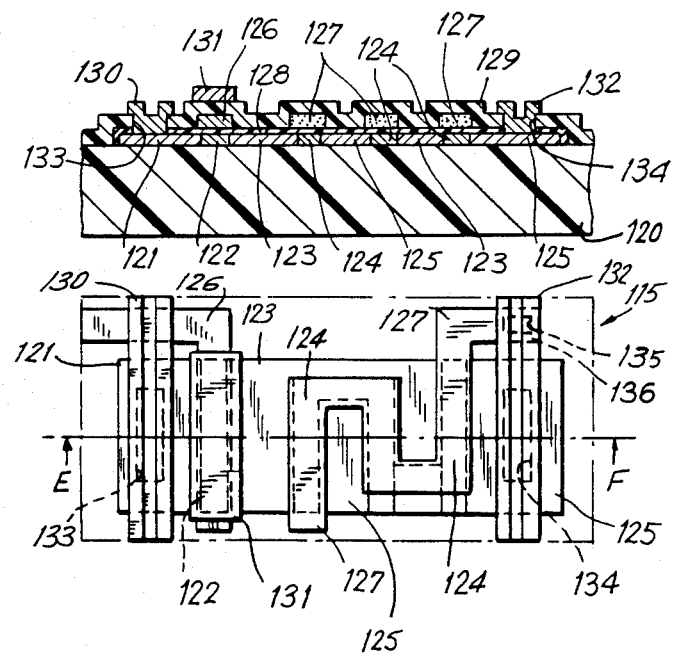
FIG. 14b
FIG. 14a
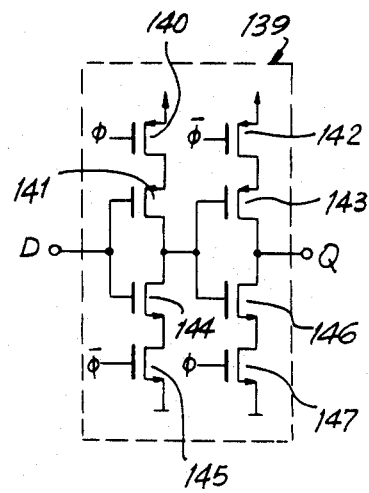
FIG. 15
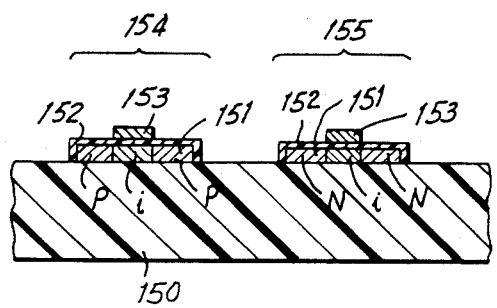
FIG. 16

SOLID STATE IMAGE SENSOR

This is a continuation of application Ser. No. 07/096,279, filed Sept. 10, 1987, which is a continuation of Ser. No. 06/569,641, filed Jan. 10, 1984 both now abandoned.

BACKGROUND OF THE INVENTION

The present invention is generally directed to solid state image sensors and, in particular, to a solid state image sensor having a plurality of sensing cells on an insulating substrate with the individual cells consisting of a photo-sensitive sensor and a high speed non-photo sensitive thin film transistor.

Heretofore, cathode ray tubes have been used to convert optical images to electrical signals. The cathode ray tubes have the twin disadvantages of being short lived an large. Recently, however MOS type CCD type image sensors have been developed.

Reference is made to FIG. 1 wherein a monochrome picture MOS image sensor in accordance with the prior art is depicted. The prior art image sensor is composed of an N×M matrix of sensing cells 3. Each sensing cell 3 consists of photo-diode 2 and a MOS transistor 1 having a gate electrode 15, a drain 13 and a source 12 to read out the charge accumulated on photo-diode 2. Gate electrode 15 of MOS transistor 1 is connected to one of a plurality of horizontal scanning lines $H_1$ to $H_M$ connected to the output of a shift register 7 which selects one of horizontal scanning lines $H_1$ to $H_M$. Source 12 of MOS transistor 1 is connected to one of the plurality of vertical video signal lines $V_1$ to $V_N$. Photo-diode 2 is connected to drain electrode 13. Each vertical video signal line $V_1$ to $V_N$ is connected to a video signal line $V_s$ by a corresponding switching transistors $S_1$ to $S_N$. Shift register 6 selects which video signal line $V_1$ to $V_N$ to energize and switches on the appropriate switching transistor 4 which places the electric signal on the chosen vertical video signal line $V_1$ to $V_N$ on to video signal line $V_s$. Shift register 6 energizes all of the switching transistors $S_1$ to $S_N$ in order during one horizontal scan. When a horizontal scanning line $H_1$ to $H_M$ is selected by shift register 7 it has the effect of placing the photo-excited electric charges of photo diodes 2 onto vertical video signal lines $V_1$ to $V_N$. The effect of this system is to place on video signal line $V_s$ in serial form the photo-induced electric charges of an entire line of sensing cells 3.

Reference is next made to FIG. 2 wherein a sensing cell formed from a monolithic semiconductor substrate in accordance with the prior art is depicted. A P-type well is formed in an N-type monocrystalline silicon substrate 10 with a field oxide layer 16 formed thereon. Diffused regions 12 and 13 which serve as a source and drain for the transistor are formed. An aluminum connector 14 and a gate electrode 15 to receive a horizontal scan signal is included. An N-type drain region 13 and P-type well 11 constitute photo-diode 2. Photo diode 2 is usually biased in the reverse direction and the charge to be stored is always kept constant in the depletion layer of the PN junction 11-13. When transistor 1 is turned on through gate electrode 15 the photo induced charge flows out onto the vertical video signal line $V_1$ to $V_N$ corresponding to sensing cell 3. The amount of charge stored in photo-diode 2 varies in proportion to the intensity of light incident thereon. Therefore, serially reading out the amount of charge in each cell on a horizontal line of sensing cells 3 allows the conversion of a line of an image to an electrical signal.

However, the devices of the prior art method have several major problems. In addition to photo-diode 2 being sensitive to light, the remaining semiconductor portions of sensing cell 3, specifically transistor 1 are photo-sensitive. This causes blooming and smear. When the incident light is strong, too much charge to be stored on photo diode 2 is present and the excessive charge is dissipated into adjacent sensing cell 3 and adjacent vertical video signal lines. This causes the production of abnormal vertical lines on the display. This phenomenon is called blooming. In addition, when the incident light strikes the lower portion of sensing cell 3 other than photo-diode 2 this invites the generation of the carrier in the depth of sensing cell 3. As a result, the display appears smeared with white. This phenomenon is called a smear. It is possible to reduce blooming and smear with improved cell construction including stricter patterning of the sensing cells or by complicating the peripheral portion of the external sense-amplifier. However, with the prior art constructions it is not possible to completely eliminate blooming and smear completely. This results in deteriorated power of the solid state image sensor and increased overall costs for manufacture.

Recently, there has been a demand for a facsimile machine or intelligent duplicator based on a line sensor at a low price and with good image processing. At present, facsimile machines can be bought for less than $1,000. Facsimile machines are composed of a read out portion, a printing portion and a communication system. The development of thermal print heads and the improvement of large scale integration techniques have lowered the manufacturing costs associated with the printing and communications components. However, the complicated optical systems required for the read out portion and the manufacturing of the sensor itself have remained high. This has kept the overall costs of manufacturing a facsimile quite high. It is therefore desirable to develop a high powered read out portion at low cost. A sophisticated powerful machine with intelligent functions such as a facsimile machine, a copy machine and a printer can be sold inexpensively if the read out portion can be manufactured at low cost.

One attempt to lower the manufacturing cost of the read out portion was a contact type sensor. The contact type sensor has recently been under consideration. However, these sensors have poor reliability, insufficient characteristics and high manufacturing costs which rule out mass production because of complication of the external treatment.

In conventional image sensors with single crystal substrates the signal to noise ratio is very poor. In addition the flaws in crystallization cause poor uniformity of response thereby making a clear gray scale display difficult to achieve.

On the other hand, solid state area image sensors of the MOS type and CCD type utilizing monocrystalline substrates have entered the market.

Although solid state image sensors of the type noted above have been used to sense images, it is noted that there is a need for a solid state image sensor which improves the signal to noise ratio and uniformity of the sensing cells so as to eliminate blooming and smear completely. Accordingly, a solid state image sensor which can eliminate blooming and smear completely is desired.

SUMMARY OF THE INVENTION

Generally speaking, in accordance with the invention, a solid state image sensor having a plurality of sensing cells is provided. The sensing cells are arranged in a line or a matrix on an insulating substrate, each cell having a photo-sensitive member for detecting the presence of light and converting the light into an electrical signal. A high speed non-photo sensitive switch coordinates the signals generated. The photo-sensitive member is a thin film of amorphous silicon and the high speed non-photo sensitive switch is a polycrystalline thin film transistor (TFT). The photo-sensitive member has a lower electrode of Al, Al-Si, Al-Si-Cu or polycrystalline silicon which is electrically connected to the drain of the corresponding thin film transistor. Because the charge generated in the photo-sensitive member is directly proportional to the incident light, the sequential sampling of the adjacent sensing cells allows for the conversion of photo images into electrical signals.

Accordingly, it is an object of the invention to provide an improved solid state image sensor.

Another object of the invention is to provide a solid state image sensor which eliminates blooming and smear.

A further object of the invention is to provide an improved solid state image sensor formed of an array of sensing cells, each cell formed of a switching transistor of polycrystalline thin film and a sensing device formed of an amorphous silicon thin film and an electrode coupled to the drain of the switching transistor.

Still another object of the invention is to provide an improved solid state image sensor formed of sensing cells, each cell formed of a polycrystalline thin film switching transistor and a sensing device of amorphous silicon thin film and an electrode, the lower electrode of the sensing device electrode unitarily formed of polycrystalline silicon with the drain of the transistor.

Yet a further object of the invention is to provide an improved solid state image sensor formed of sensing cells, each cell formed of a polycrystalline thin film switching transistor and a sensing device of amorphous silicon thin film and an electrode, wherein the photosensitive layer is an electrode of a capacitor having a current output of less than 1pA in the dark and more than several pA/lux in the light.

Yet another object of the invention is to provide a solid state image sensor from two different semiconductor substances on the same substrate.

Yet a further object of the invention is to provide an improved solid state image sensor formed of a polycrystalline silicon thin film switching transistor and a sensing member wherein the sensing member is the channel region of the transistor.

Another object of the invention is to provide an improved method for preparing a solid state image sensor having an array of sensing cells formed of a switching transistor coupled to a photo-sensitive member.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 11b is a cross-sectional view of the sensing cell taken through line AB of FIG. 11a;

FIG. 14a is a plan view of another embodiment of a sensing cell of an image sensor constructed in accordance with the invention;

FIG. 14b is a cross-sectional view of the sensing cell of FIG. 14a taken along line EF;

FIG. 15 is a circuit diagram of a scanning circuit in accordance with the invention;

FIG. 16 is a cross-sectional view of a CMOS-TFT transistor in the circuit of FIG. 15;

DETAILED DESCRIPTION OF THE PREFERRED EMBODIMENTS

Figure 3:
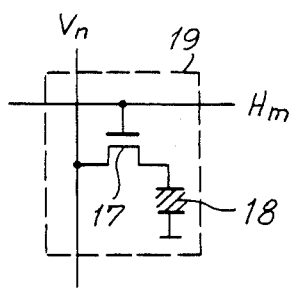
FIG. 3 is a circuit diagram of a sensing cell in accordance with the present invention.

Reference is made to FIG. 3 wherein the circuit of a sensing cell 19 of a matrix constructed in accordance with the invention is depicted. Sensing cell 19 includes a film transistor (TFT) 17 and a thin film sensing layer 18 formed on an insulating substrate such as a glass. Transistor 17 is used to select the proper cell and thin film sensing layer 18 serves as a sensing device. A plurality of sensing cells 19 can be used in either a line sensor or an area image sensor.

When an amorphous silicon thin film is used for sensing layer 18 the light sensitivity of sensing cell 19 is increased because amorphous silicon film has a small dark current and a large light absorption co-efficient. An area sensor, thus constructed, is able to sense an image in a wide range of light intensities varying from indoor darkness to outdoor brightness. In addition, sensing layer 18 can be enlarged to cover transistor 17 thereby enlarging the sensing area of sensing cell 19. Transistor 17 must have two characteristics. First, it must operate at a high switching speed, and second, it must be extremely insensitive to incident light.

When incident light strikes transistor 17, current leakage may discharge the stored charge if transistor 17 is made of a material which easily generates a current. This current leakage and discharge results in the destruction of the image. In accordance with this invention the channel portion is polycrystalline silicon which has a high channel mobility and a small light absorption co-efficient. Sensor 18 is formed of an amorphous silicon thin film which has a small dark current, and a low mobility and a large photo current. Transistor 17 which selects the appropriate sensing cell 19 and the transistors in the peripheral portions of the solid state image sensor are made of polycrystalline silicon thin film which have higher mobility and a smaller photo current than the amorphous silicon thin film of sensing layer 18.

Figure 4:
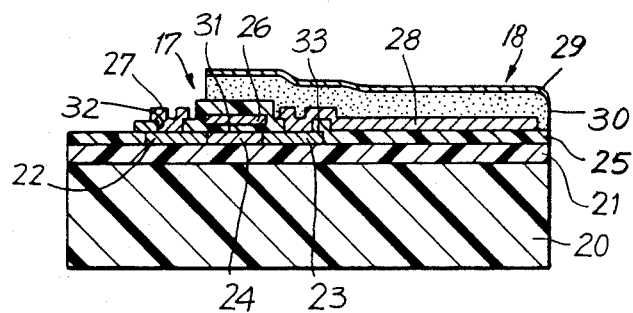
FIG. 4 is a cross-sectional view of a sensing cell constructed in accordance with the present invention.

Reference is next made to FIG. 4 wherein a cross-sectional view of sensing cell 19 constructed in accordance with the present invention is depicted. Sensing cell 19 will be described in the sequence that it is manufactured. An oxide layer 21 is grown on an insulating substrate 20, for example a single crystalline silicon. A polycrystalline silicon thin film used in forming a thin film transistor is formed on layer 21 and patterned to provide an island wherein a source region 22, a drain region 23 and a channel 24 region are formed. A gate insulation layer 31 is formed and a gate electrode 26 of thin film transistor 17 is formed. A second insulation layer 25 is formed and contact holes 32 and 33 are made so that electrical connection to source region 22 and drain region 23 may be made. A vertical video signal electrode 27 and a lower electrode 28 of the sensing cell are formed by patterning and connected to a source 22 and drain 23, respectively. An amorphous silicon, for example, thin layer 30 which functions as the photo-sensitive member is formed over the portion of the surface of substrate 20 shown in FIG. 4. An upper electrode 29 constructed of transparent conductive thin film is formed thereon.

A semiconductive material, such as Cd-Se, amorphous, polycrystalline or large grain polycrystalline silicon thin film grown by annealing are suitable for the thin film semiconductive material of the TFT. An amorphous film such as Zn-Se, Cd-Te, Se-As-Te, and Si; or a polycrystalline layer of Si and the like are suitable for the photo-sensitive thin layer. Sensing thin film 30 turns out to be a sensing resistance device or PN junction depending on the material used in upper electrode 29 and lower electrode 28. Sensing thin film 30 should, upon sensing light induce a great amount of photo excited current and exhibit high impedance in the dark.

Figure 5:
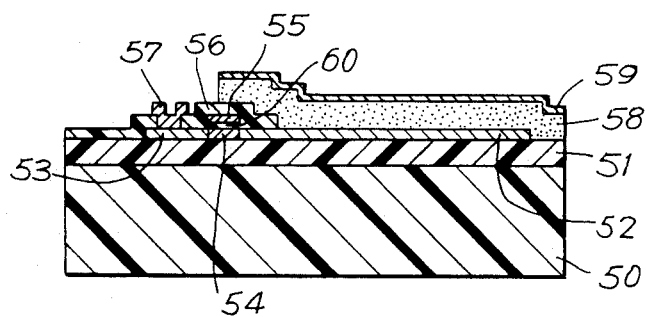
FIG. 5 is a sectional view of another embodiment of a sensing cell constructed in accordance with the invention.

In FIG. 5 another embodiment of a solid state image sensor constructed in accordance with the invention is depicted. An insulating layer 51 is formed on an insulating substrate 50 which may be a single crystalline silicon substrate, glass and the like. A polycrystalline silicon thin film for forming the transistors is formed on insulating layer 51 and patterned to provide islands where a source 53, a drain 52 and a channel region 54 are formed. The thin film island forming drain region 52 is expanded so as to also act as the lower electrode of the photo-sensitive member as electrode 28 in the embodiment of FIG. 4. The transistor elements include source 53, channel 54, a gate insulation layer 60, a gate 55, a vertical video line 57, a photo-sensitive film 58 and an upper electrode 59 which are all similar in construction to the corresponding elements in the embodiment of FIG. 4. The difference between the embodiment of FIG. 4 and FIG. 5 is that lower electrode 28 is an aluminum electrode connected to drain 22 of TFT 17, whereas lower electrode in FIG. 5 is formed by extending the semiconductor film which forms the drain region.

Sensitive films 30 and 58 have the most preferable features if made from amorphous silicon (a-Si) film. The a-Si film is usually formed by a plasma CVD process which has a low dark current generates higher photocurrents at faster rates in response to light. Upper electrodes 29, 59 are made of, for example, ITO (Indium Tin Oxide). Schottky junctions are formed by using an intrinsic layer (which is not doped with an impurity). This construction results in photo response speeds of less than 10 $\mu$sec so that high speed reading is achieved. An a-Si film consisting of three layers such as p-i-N layer beneath upper electrodes 29 and 59 is suitable for the thinner films of about 5000Å. Such a film is advantageous as it has increased storage capacity and an increase in the amount of the signal electrical charge.

In the embodiment of FIG. 4 the material used to form electrode 28 should provide a flat surface and must not diffuse into photo-sensitive film 30 formed of an a-Si film and the like. It must make good contact with silicon in order to prevent lower electrode 28 and upper electrode 29 from short circuiting. For example, a layer made of Al-Si-Cu is smooth with few projections and can provide an even thicknesses from 1000 to 5000 Å and makes good contact with Si. When lower electrode 52 in the embodiment of FIG. 5 is polycrystalline silicon, the impurities within the polycrystalline silicon do not diffuse at low temperature thereby preventing the short circuiting of upper electrode 29 and lower electrode 28.

The advantages of an image sensor including sensing cells in accordance with the invention are as follows. Because the substrate is a transparent and insulating material excessive incident light is transmitted to the lower portion, which prevents the occurrence of current frequently found in a monocrystalline silicon substrate. Further, the occurrence of noise in the vertical line and an adjacent cell can be completely avoided This is true even where excessive incident light is applied to the thin film sensing device because the sensor is formed on an insulated substrate. Blooming and smear which often occurs in conventional semiconductive substrates can be avoided because the thin film transistor is formed on an insulating substrate with the thin film sensing device on top of it.

Figure 1:
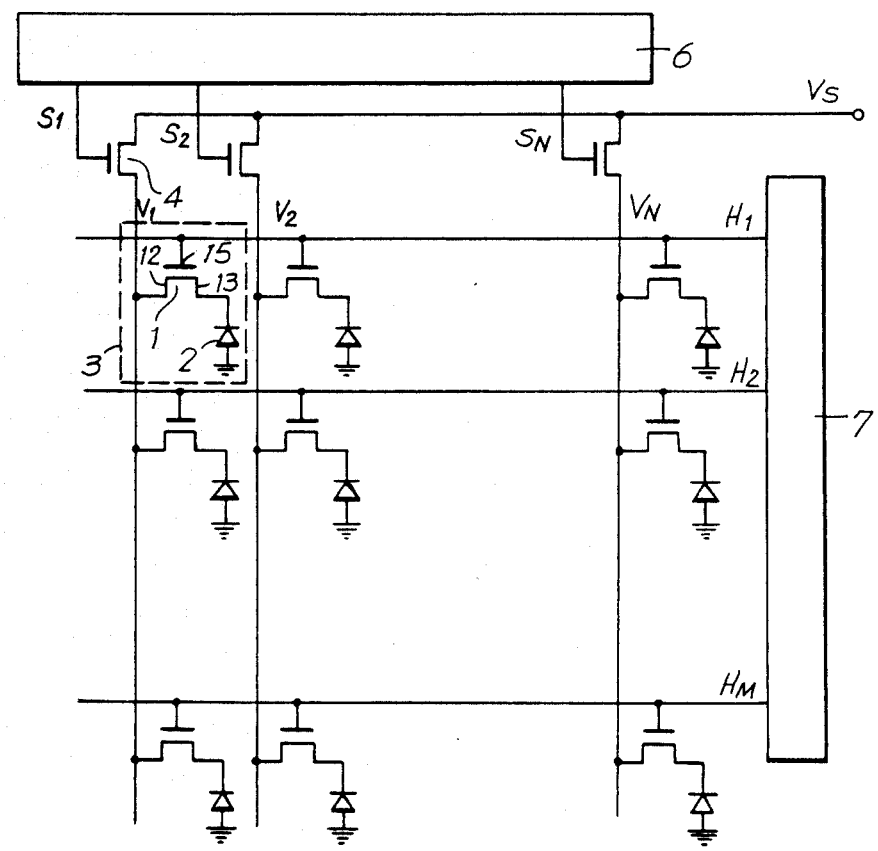
FIG. 1 is a circuit diagram of an image sensor including a matrix array of sensing cells in accordance with the prior art.
Figure 2:
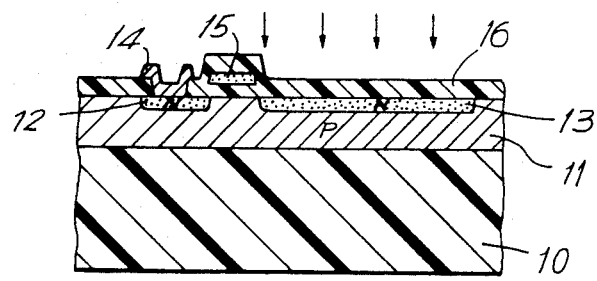
FIG. 2 is a sectional view of a sensing cell of the type utilized in the image sensor of FIG. 1.
Figure 6A:
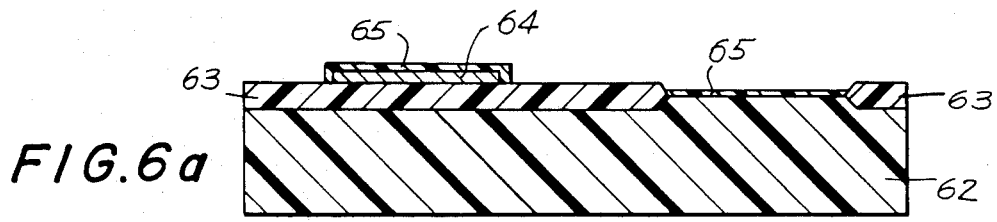
FIGS. 6a, 6b and 6c are cross-sectional views of a sensing cell constructed in accordance with the invention showing the steps of construction.
Figure 6B:
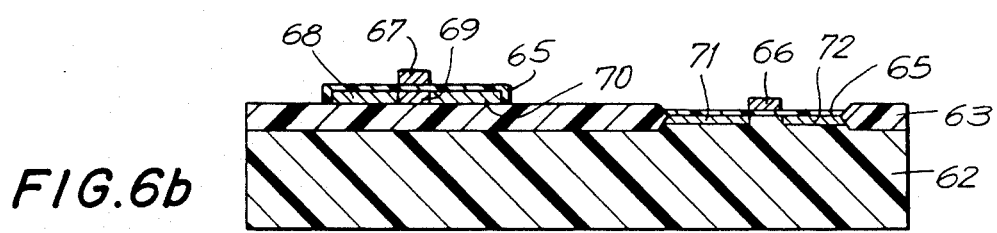
Figure 6C:
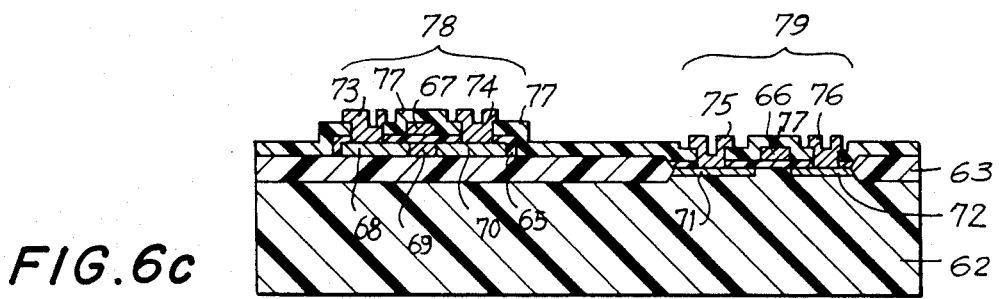

In this embodiment of the invention, the sensing cells are formed of thin films. However, it may be difficult to construct the peripheral devices, such as the high speed shift registers and switching transistors shown as 4, 6 and 7 in FIG. 1 utilizing a thin film. To solve this problem, the peripheral devices are formed on a single crystalline substrate with the sensing cells. This allows the peripheral devices to operate at high speed and the sensing cells to be constructed from thin film. The array of sensing cells is still constructed from thin film, but the peripheral devices are FIGS. 6(a), 6(b) and 6(c) illustrate the steps in a process for manufacturing the image sensor in accordance with this embodiment of the invention. A thin film device 78 and a bulk device 79 are formed on a substrate 62 in a common process. A field oxide layer 63 is formed on a single crystalline substrate 62. A polycrystalline silicon layer 64 is formed to make thin film transistor 78. A gate insulating layer 65 is formed by thermal oxidation. Gate electrodes 66 and 67 are formed by depositing a polycrystalline silicon layer. Ions are implanted to form a source 68 and a drain 70 of thin film transistor 78 and a source 71 and a drain 72 of bulk transistor 79. Insulating layer 77 which may be an oxide layer is deposited by CVD. After contact holes are made, aluminum electrode layers 73, 74, 75, and 76 are formed. Thin film transistor 78 serves as the transistor for selecting one of the sensing cells and bulk transistor 79 is for a peripheral circuit. Thus, thin film transistor 78 and bulk transistor 79 can be formed with the same process. In contrast, the conventional image sensor is constructed in a complex manner to prevent blooming and smear. The image sensor constructed in accordance with this embodiment of the invention offers an improved image sensor free from these undesirable characteristics and ease of construction.

The peripheral circuits, are conventionally constructed with N-type MOS transistors. To achieve their high speed signal transfer, these transistors consume a large amount of power. To make matters even worse, the electrical characteristics of the N-Type MOS transistors shift due to heat. However, the peripheral circuits can be integrated into a C-MOS circuit and a shift register having high-speed and low power consumption can be provided by a simple manufacturing procedure and a simple construction in accordance with this invention. In this embodiment the shift of electrical characteristics due to heat can be avoided.

Figure 7:
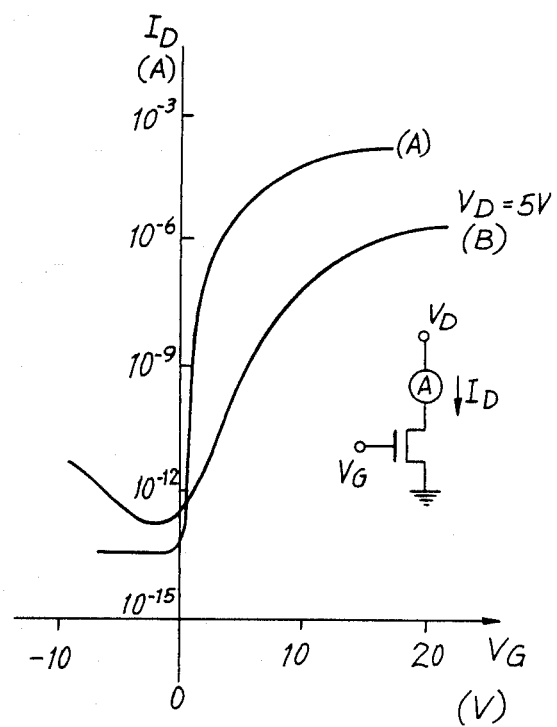
FIG. 7 shows the V-I characteristics of TFT and MOS transistors in the sensing cell of FIG. 6.

Reference is next made to FIG. 7 wherein the V-I characteristics of a TFT and an MOS transistors are depicted. Curve A and curve B indicate the characteristics of the TFT and MOS transistors of general bulk silicon, respectively which are made in accordance with the embodiment illustrated in FIG. 6. With reference to curve A, although one to two columns of mobility are lowered, the TFT has sufficient speed to operate the sensing cell array.

A solid state image sensor constructed in accordance with this invention reduces blooming by about 30 to 40 dB and smear by 20 dB when the transistor for selecting the sensing cell and the sensing film are formed from thin film semiconductor materials. Also, the saturation intensity of instant light can be increased by 6 dB over the conventional image sensor, since the effective area of the sensing thin film can be enlarged. The light absorption coefficient is also improved and photo-sensitive gain is increased by 10 to 20 dB when amorphous silicon is used instead of single crystalline silicon. This results in a 30 to 40 dB improvement in dynamic range of photo-sensing compared to a conventional solid state image sensor. Formation of the peripheral circuits with CMOS integration contributes to a reduction in power consumption. In an array 400 wide by 300 high in a two-thirds of an inch sensor the conventional power consumption in an N-MOS construction is 500 mW. With CMOS integration power consumption is reduced to 80 mW.

Figure 8:
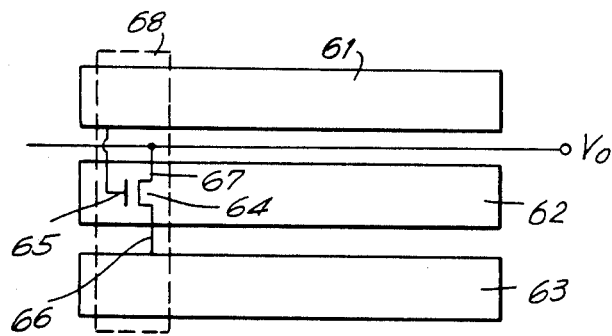
FIG. 8 is a block diagram of an image sensor constructed in accordance with the invention.

Reference is next made to FIG. 8 wherein a block diagram of N sensing cells as shown in FIG. 3, formed in a linear format is shown. Discharged current proportional to the intensity of incident light stored in a photo cell 63 is delivered to output terminal $V_o$ by energizing a switching transistor 64 in a controller 62. The photo-generated current from N photo cells 63 in the array is delivered to output terminal $V_o$ in series. This results in a video signal train at output terminal $V_o$. It has the effect of converting the incident light into an output current. In other words, the total photons irradiated onto N photo cells is converted into the output current. This feature of invention includes all devices, like the switching transistor and the photo sensor made of a thin film semiconductor.

Figure 9:
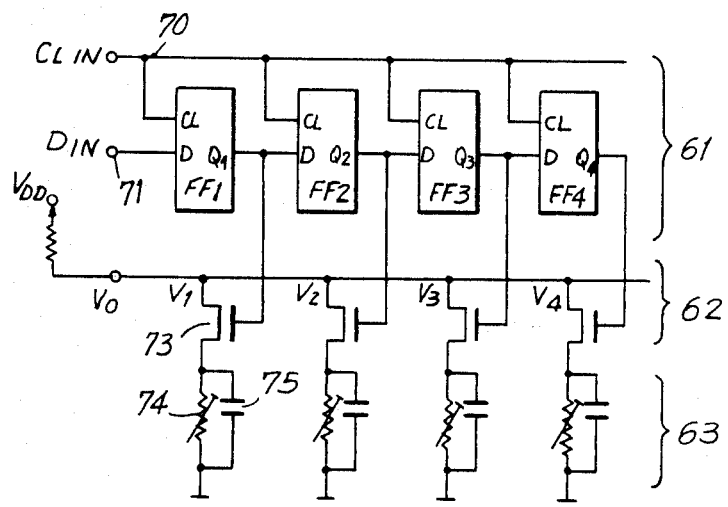
FIG. 9 is a circuit diagram of an image sensor constructed in accordance with the invention.
Figure 10:
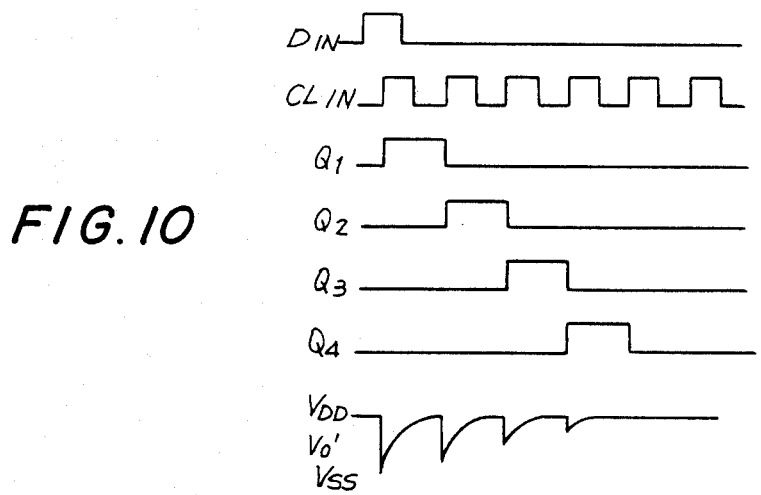
FIG. 10 shows the values of various signals in the circuit depicted in FIG. 9.

FIG. 9 shows a detailed block circuit diagram of the device of FIG. 6 and FIG. 10 illustrates the shape of the signal waves at various points within the circuit diagram. When a starting signal $D_{IN}$ and a clock pulse $CL_{in}$ are respectively applied a series of flip flops $FF_1$, $FF_2$, $FF_3$ through $FF_N$ of shift register 61, the flip flops respectively output timing signals $Q_1$, $Q_2$, $Q_3$ through $Q_N$. Then the switching transistor array 62 is selected in series by timing signals $Q_1$ through $Q_N$. The electric current which is generated in photo-diode array 63 is outputed at terminal $V_o$ as a video signal, $V_o'$. Peak values $V_1$, $V_2$, $V_3$ through $V_N$ of video signal $V_o'$ correspond to the amount of light received in each sensing cell. Thus, the video signal is proportional to incident light and is obtained by passing video signal $V_o'$ through a low-pass filter and peak hold circuit.

Figure 11B:
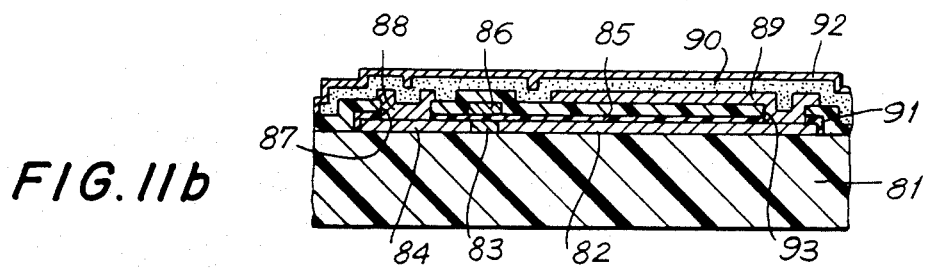
Figure 11A:
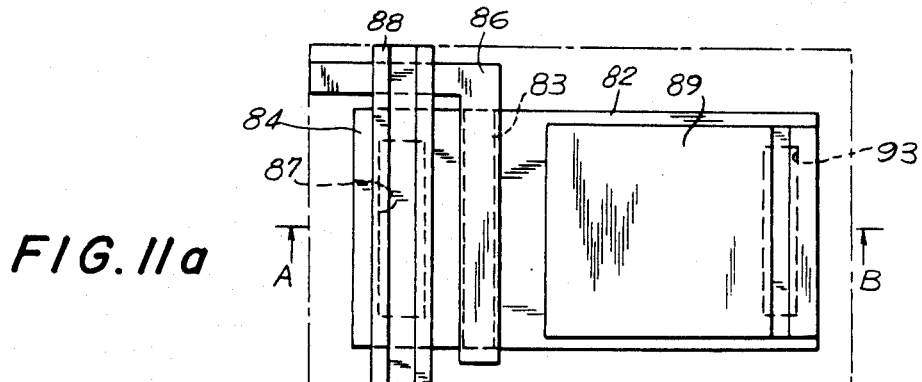
FIG. 11a is a plan view of another embodiment of a sensing cell of an image sensor constructed in accordance with the invention.

FIGS. 11(a) and 11(b) illustrate a switching transistor and photo-sensitive member in accordance with another embodiment of the invention, in a plan view and cross-section, respectively. A polycrystalline silicon thin film is deposited on a substrate 81 of glass, ceramic or the like insulator and is patterned to form a source 84, channel 83 and drain region 82. A thin gate film 85 to insulate a gate 86 is formed by thermal oxidation or a CVD process. Thin gate electrode material, such as polycrystalline silicon or the like is deposited and patterned to form gate 86. Source 84 and drain 82 of P-type or N-type regions are formed by ion implantation. An insulator between layers, for example a silicon oxidation film 91 is formed by CVD. Contact holes 87 and 93 are opened in film 91 and a vertical video signal line 88 and a lower electrode 89 of aluminum are formed. A photo-sensitive layer 90 of for example, amorphous silicon is deposited across the substrate by a plasma CVD process, and an upper electrode 92 of a transparent electrode material is formed thereon.

The characteristics of photo-sensitive layer 90 are adjusted so that the current is less than one 1pA in the dark and the current is more than several pA/lux in the light. This embodiment has the advantage that sensitive layer 90 also serves as a capacitor. If sensitive layer 90 is composed of amorphous silicon the current in the dark is remarkably small in contrast to the photo current which is large. This makes it suitable for reading incident light.

Figure 18:
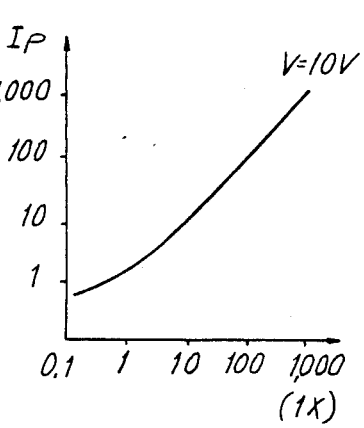
FIG. 18 graphically depicts the photo characteristics of the sensitive layer of a sensing cell utilized in the invention.

FIG. 18 illustrates a typical relationship between photo-excited current and incident light intensity of an amorphous silicon film then illumination of more than one lx (1 lux) is used. The construction of the image sensor was as depicted in FIG. 11. The sensor was easily made because the construction is multilayered vertically and can be formed by merely depositing thin film without having to etch off the upper electrode.

Figure 12B:
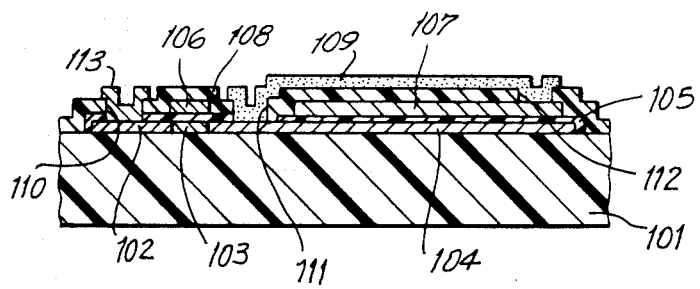
FIG. 12b is a cross-sectional view of the sensing cell of FIG. 12 taken along line CD.
Figure 12A:
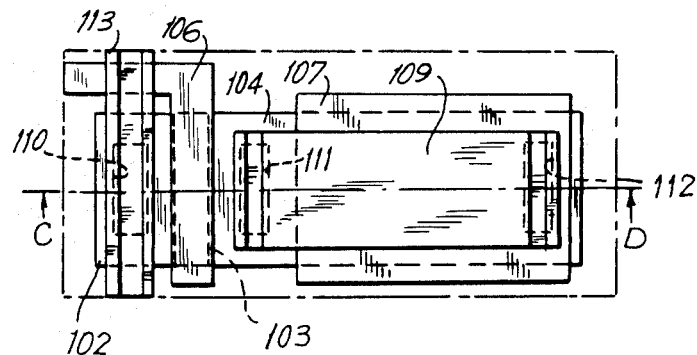
FIG. 12a is a plan view of a further embodiment of a sensing cell of an image sensor constructed in accordance with the invention.

Reference is made to FIGS. 12a and 12b wherein a sensing cell 100 of a solid state image sensor constructed in accordance with a further embodiment of the invention is shown. Cell 100 includes a photo-sensitive layer 109 disposed horizontally on a substrate. A thin film silicon transistor and an upper electrode are formed on substrate 101 by CVD. Then a lower electrode portion 104 of a capacitor for storing the electric charge is formed of N-type or P-type layer by an ion implantation process in a silicon thin film. A gate electrode 106 and an upper electrode 112 of capacitor 107 are formed of polycrystalline silicon or the like. An N-type or P-type source region 102 of the switching transistor is formed by ion implantation. A channel portion 103 is an intrinsic region and a drain electrode 111, a gate electrode 106, an upper electrode 112 of capacitor and an insulating film 105 are formed as described above. An insulating film 108 is deposited thereon. Contact holes 110, 111 and 112 are opened in film 108 and a vertical video signal line 113 and a photo-sensitive layer 109 are deposited.

Photo-sensitive layer 109 is of a semiconductor material sensitive to light like CdS, amorphous silicon or the like, and is disposed in parallel to the capacitor. When photo-sensitive layer 109 is not irridiated, its resistance is very high and an electric charge stored in the capacitor is not discharged. On the other hand, when photo-sensitive layer 109 is irradiated the resistance of photo-sensitive layer 109 is lowered and the electric charge in the capacitor is discharged. The discharged current flows into vertical video signal line 113 when the switching transistor is turned on. The embodiment depicted in FIGS. 12a and 12b is advantageous in that the upper and lower electrodes surrounding photo-sensitive layer 109 shown in the embodiment of FIGS. 11a and 11b can be eliminated, and is usable even where the film has many pin holes.

Figure 13:
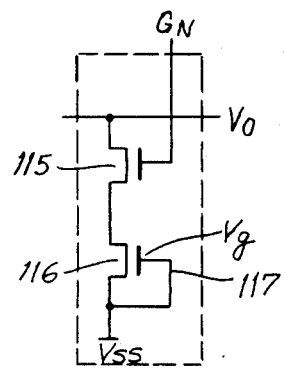
FIG. 13 is a circuit diagram of a circuit wherein a transistor is a photo sensitive member in accordance with the invention.
Figure 17:
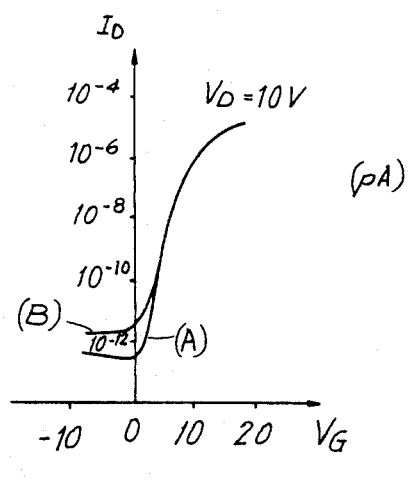
FIG. 17 graphically depicts the characteristics of an N-TFT transistor utilized in accordance with the invention.
Figure 19:
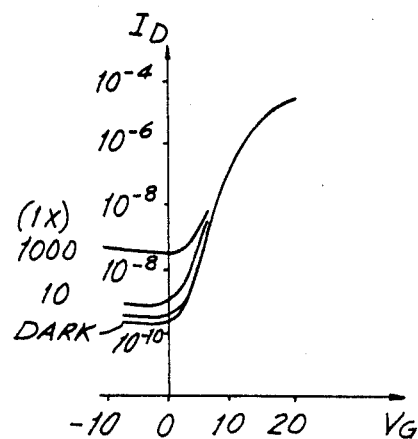
FIG. 19 graphically depicts the photo characteristics of the photo-sensitive layer of a sensing cell when the polycrystalline silicon thin film of a TFT is utilized as the sensitive member.

FIG. 13 illustrates a circuit of a sensing cell in accordance with another embodiment of the invention. In this embodiment, a first transistor 116 plays the role of a photo-sensitive film. The voltage-current characteristics of transistors 116 as the intensity of incident light is varied is shown in FIG. 19. This characteristic showing the amount of photo-excited current is controlled by varying the gate voltage $V_g$. The cell of FIG. 13 is constructed for simplicity with $V_g$ equal to zero.

Referring now to FIGS. 14a and 14b a sensing cell 115 of a solid state image sensor in accordance with another embodiment of the invention is depicted. A first silicon thin film is formed on substrate 120 and then patterned to form an island for the source, channel and drain regions. A gate insulating film 128 is then formed on this thin film by a thermal oxidation process or the like. Thereafter, gate electrodes 126 and 127 are formed thereon. A source region 121, a channel region 122, a drain region 123, a photo-sensitive channel 124 and a fixed electrode 125 are formed by an N-type or P-type ion implantation process. Subsequently, an insulating film 129 is formed thereon. Contact holes 133, 134 and 135 are opened in film 129 in the region above source region 121 and fixed electrode 125. A vertical video signal output line 130, a light protection layer 131 and a line 136 applying a fixed potential to the transistor are formed from aluminum. This has the effect of making channel 124 of the transistor serve as the photo-sensitive layer. Light protection layer 131 is added to prevent channel region 122, which is photo-sensitive, from contact with incident light. Gate electrode 127 is patterned in an "S" configuration over the thin film to provide an S-shaped channel region 124. The parasitic capacitance between gate electrode 127 and drain region 123 is utilized to store the photo-excited current.

The scanning circuit required to operate a solid state image sensor in accordance with the present invention must be very fast. For example, when there are 1000 elements and the read out cycle is 1 msec, the scanning speed must be 1 MHz. This requires a shift register and transistor to operate at super-high speed in the scanning circuit.

FIG. 15 illustrates one sensing cell 139 of a C-MOS scanning circuit for ah image sensing cell constructed in accordance with the invention. Sensing cell 139 is constructed of P-channel thin film transistors (P-TFT) 140 through 143 and N-channel thin film transistors (N-TFT) 144 through 147.

Reference is next made to FIG. 16 wherein a C-MOS-TFT of the circuit of FIG. 15 is depicted. A first silicon thin film 151 is formed on substrate 150 and patterned to form islands. A gate oxide film 152 is formed and a gate electrode 153 is formed. Subsequently, P-channel transistor 154 is formed by implanting boron ions and a N-channel transistor 155 is formed by implanting phosphorous or arsenic ions. One advantage of constructing this embodiment utilizing thin film transistors is that a C-MOS construction can easily be formed from monochannel construction (CN-MOS or P-MOS). It requires merely adding one more implantation process. This process is hard to realize in a conventional way. The CMOS construction is advantageous because P-type and N-type channel regions provide an intrinsic region which does not include an impurity.

Because the invention requires high-speed transistors for the scanning circuit and switching transistors the characteristics of the transistors must be improved. Favorable characteristics are obtained by using a thermal oxide film as a gate insulating film to form a transistor. A silicon thin film approximately 2000 to 5000 Å thick without impurities is formed at a deposition temperature of 570° C. as so to construct the channel, source and drain sections of the first layer. The channel, source and drain portions are then patterned. The thin film is then thermally oxidized in an $O_2$ atmosphere at about 1100° to 1150° C. so as to form, preferably a gate insulating film about 1500 Å thick at the same time that the drain of the first silicon thin film is formed, preferably of a polycrystalline silicon. A gate electrode of polycrystalline silicon which is N+ doped is formed and P ions are implanted with a dose amount of $1 \times 10^{15}/cm^2$ by using the gate electrode as a mask so that only the channel region remains intrinsic. The transistor characteristics are further improved by a $H_2$ plasma process. In the embodiments shown in FIGS. 11a and 11b and 12a and 12b, when amorphous silicon is formed as a photo-sensitive film by a plasma CVD with hydrogen, the thin film transistor (TFT) is also formed by plasma CVD at the same time. This process is also applicable to the embodiment of FIGS. 14a and 14b.

When the sensing cell has been bombarded with incident light it is necessary to direct the photo-excited current flows in the source and drain regions when the TFT is not energized. Generally, polycrystalline silicon has a small light absorption co-efficient, however, it is possible to decrease the light absorption further by thinning the polycrystalline silicon layer of the channel portion of the TFT. In addition, the effective mobility of the transistor may be improved by increasing the effective current in the ON state of the transistor because expansion of the depletion layer caused by the applied voltage of the gate electrode is limited at the same time. In other words, the current leakage is reduced in the OFF state and the current in the ON state is increased by thinning the polycrystalline silicon thin film at the channel portion. Based on experimental results, these results can be attained at a thickness of less than about 3000 Å, and more preferably less than about 2600 Å.

FIG. 15 shows the voltage versus current (V-I) characteristics of a transistor having the above described effects wherein the polycrystalline silicon film is about 1500 Å thick and formed with a $H_2$ plasma process. Curve (A) shows the characteristics in the dark. Curve (B) shows the characteristic when there is less than 30,000 lux and the carrier mobility is very large, approximately 50 cm$^2$/V.sec and the photo-current is almost zero at about 100 lux. A shift register in the scanning circuit constructed by using such a transistor operates at a speed within the range of about 10 to 20 MHz. This operating speed is satisfactory for the solid state image sensor application. The switching speed of the switching transistor is about 30 nsec.

When a solid state image sensor is constructed as a line sensor in accordance with the present invention, the scanning circuit and switching circuit are constructed out of thin film transistors, and the photo-sensitive member is a thin film, the following advantages exist.

(1) There is no limit on the size of the sensor because the sensor is formed on an insulating substrate by a simple process. A tight-contact sensor 10 through 30 cm long can be manufactured inexpensively.

(2) The image sensor constructed in accordance with this invention is connected by at most 10 wired connections to the exterior circuit because the device includes the scanning and switching circuits on the same insulating substrate. This further reduces the cost of the manufacture. In addition, parasitic capacitance is very small and the amplitude of the output signal is close to the source voltage amplitude thereby improving the signal to noise ratio. This satisfactory signal level is guaranteed without using a complicated amplifier. Visual images of high quality and resolution may therefore be transferred.

(3) Using a polycrystalline silicon TFT for the switching transistor increases switching speed, reliability and stability. This transistor can be made in C-MOS form with the resulting high switching speed and low power consumption. In addition, the manufacturing process is simplified thereby lowering the production cost of the sensor.

(4) The photo-sensitive layer is thinned so that variation and sensitivity over time is reduced compared to monocrystalline silicon. As a result, variation and sensitivity of a plurality of sensors in a line is greatly reduced.

(5) The parasitic capacitance of the transistor is very small because both the wiring of the output line and the transistor are formed on an insulating substrate. This allows the voltage amplitude to be large when the signal charge of the photo-sensitive cell is read out. A conventional semiconductor substrate of monocrystalline silicon has high parasitic capacitance and small output amplitudes. This sometimes results in the noise being greater than the signal. This invention eliminates this disadvantage and provides a favorable signal to noise ratio.

Figure 20:
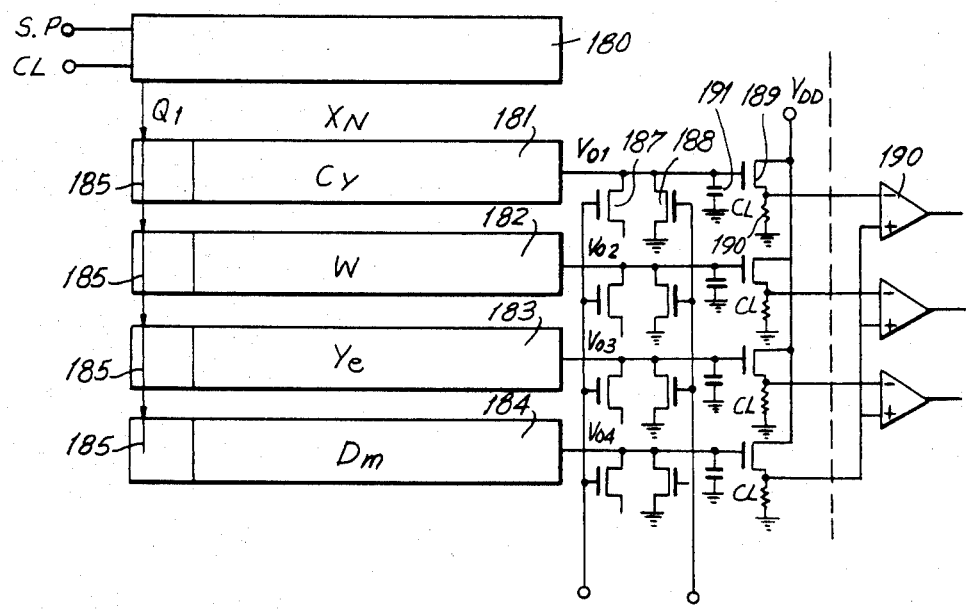
FIG. 20 is a circuit diagram of a color image line sensor constructed in accordance with the invention.

Reference is next made to FIG. 20 wherein a color image line sensor for a color facsimile device or a color copier constructed in accordance with the present invention is depicted. This construction includes a scanning circuit 180 similar to those shown in FIGS. 15 or 16. The color image line sensor has four linear sensitive cells array 181, 182, 183 and 184, which are selected in a serial manner by output from a scanning circuit 180. Four pair of transistors 187 and 188 are used to charge video signal lines $V_{01}$, $V_{02}$, $V_{03}$ and $V_{04}$, respectively. A transistor 189 serves as a source follower buffer and is coupled to a resistor 190 which is coupled to ground.

A capacitor 191 is connected to the output so as to filter out some of the noise component in output lines $V_{01}$ and $V_{04}$. Sensitive cell arrays 181, 182 and 183 have color filters such as cyan 181 (Cy), white 182(W) and yellow 183 (Ye) on top of the photo-sensitive elements for color resolution. Red, green and blue color filters can also be used for providing full colors, but three different color filters are required to resolve the color spectrum. Sensitive cell array 184 serves as a dummy which is constantly in the dark. The output current from the dark cell array 184 is applied to differential amplifiers where the dark signal is subtracted from the video signal in order to improve S/N. In practice, dummy cell 184 is formed by covering the upper layer with black or is a transistor formed without a photo-sensitive portion. The output of the signal from dummy array 184 is subtracted from the video signals $V_{01}$, $V_{02}$ and $V_{03}$ from filtered arrays 181, 182 and 183 in differential amplifiers 190. This has the effect of improving the signals to noise ratio.

Figure 21:
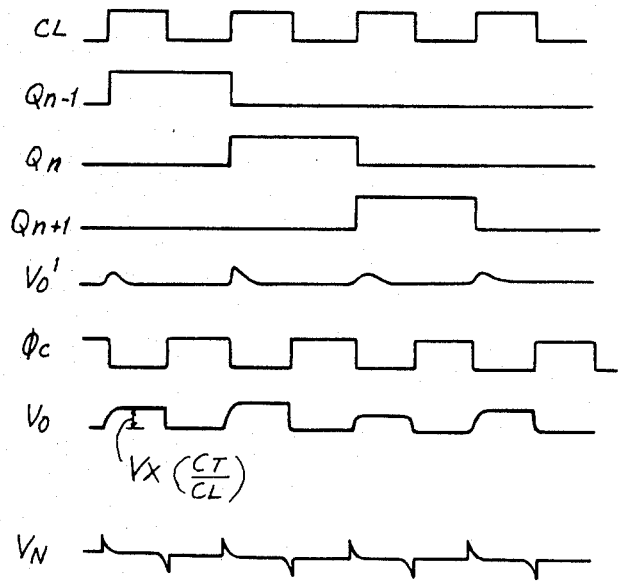
FIG. 21 depicts various signals present in the embodiment of FIG. 20.

Reference is next made to FIG. 21 wherein the wave forms of various signals within the circuit of FIG. 20 are depicted. Scanning circuit 180 generate pulses $Q_{n-1}$, $Q_n$, $Q_{n+1}$ and so forth in response to a starting pulse SP and a clock pulse CL. Pulses $Q_{n-1}$, $Q_n$ and $Q_{n+1}$ are delivered to control sections 185 of photo-sensitive cell arrays 181, 182, 183 and 184. When the parasitic capacitance of the output line is set to CL and the capacitors of the photo-sensitive cells are set to CT, the maximum output amplitude equals (V×CT/CL), where V represents an applied voltage of the photo-sensitive portion.

The video signals from photo-sensitive cell arrays 181, 182, 183 and 184 are read out to video signal lines $V_{01}$, $V_{02}$, $V_{03}$ and $V_{04}$, in synchronization with pulses $Q_{n-1}$, $Q_n$, $Q_{n+1}$ and so on. Where the video signal line is merely connected to a passive network such as in the embodiment of FIG. 9 the shape of the video signal looks like $V_0'$. If the video signal is the integrated wave form $V_0'$, the amplitude of the video signal is so small as to worsen the signal to noise ratio. In order to avoid this worsening signal to noise ratio, the amplitude of the video signal is controlled by using transistor 188 instead of the passive components of the embodiment depicted in FIG. 9.

Transistor 188 is synchronized with clock pulse $\phi_c$. During the first part of the video signal read out transistor 188 is deenergized causing the signal charges on sensitive cell arrays 181, 182, 183 or 184 to be transferred with the amplitude kept constant by capacitance component CL of video signal lines $V_{01}$ through $V_{04}$. This maintains the peak level of V0'. During the second part of reading out the video signal, transistor 188 is energized by synchronized clock pulse $\phi_c$ and all the photo-sensitive cell arrays are charged up. Using transistor 188 in this manner produces a $V_0$ wave form which hold its peak level and elevated amplitude. This is accomplished by ordering the reading out of video signal, transferring charge from the sensitive cell array and charging up the sensitive cell array.

Use of transistor 188 has the effect of significantly improving the signal to noise ratio. However, noise like $V_N$ resulting from parasitic capacitance at the overlap portions of the source and drain of transistor 188 cause additional noise. This noise can be cancelled by utilizing transistor 188 which is synchronized with clock pulse $\phi_c$ which is the inverted phase of clock pulse $\phi_c$. The source cf transistor 187 should be opened or fixed to a constant voltage level.

Therefore, the embodiment of the present invention depicted in FIGS. 20 and 21 has several advantages. The amplitude of the video signal read out can be held constant during a fixed interval, the noise component cause by the parasitic capacitance of transistor 188 can be completely cancelled by utilizing transistor 187 and dummy sensitive cell array 184 which is input into differential amplifiers 190 cancels out the dark current components from the sensing arrays 181, 182 and 183.

Accordingly, a solid state image sensor constructed in accordance with the present invention has, among others, the following advantages.

(1) All the devices are thin and formed on an insulator which eliminates the need to improve the poor performance resulting from using a conventional monocrystalline silicon substrate. In addition, the insulating substrate can easily be made large so that a large image sensor can be produced inexpensively. Since the sensor is larger the optics do not have to be as complicated and expensive as conventional devices.

(2) Because all the devices are formed on an insulating substrate the parasitic capacitance of the output line is greatly reduced. The signal to noise ratio which was a problem with conventional image sensors is also greatly reduced. Blooming, smear and the like are also largely reduced as charge mobility is eliminated. Further, because the sensitivity characteristics are determined by the features of thin film, there is improved uniformity. Therefore, the performance of a solid state image sensor constructed in accordance with the present invention is greatly improved over the prior art.

It will thus be seen that the objects set forth above, among those made apparent from the preceding description, are efficiently attained and, since certain changes may be made in the above constructions and process without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention, which as a matter of language, might be said to fall therebetween.

What is claimed is:

1. A solid state image sensor having a plurality of photo-sensitive sensing cells arranged in a line or matrix, comprising:
    an insulating substrate having a plurality of photo-sensitive sensing cells arranged on the insulating substrate;
    each sensing cell including a photo-sensitive member and a switching transistor electrically coupled thereto;
    each photo-sensitive member formed of a lower electrode region on the insulating substrate, a thin film of photo-sensitive amorphous silicon semiconductor on the lower electrode region and an upper electrode region on the photo-sensitive film, said photo-sensitive silicon film having high photo-current and having high impedance in the dark;
    each switching transistor associated with a photo-sensitive member being a thin film transistor formed by disposing a thin film of a poly-crystalline semiconductor material forming an island of semiconductor material on the insulating substrate, said semiconductor material being selected to have high channel mobility and a low light absorption coefficient and being doped with an impurity forming a source and drain of the switching resistor and having an intrinsic channel region in the polycrystalline film having a thickness of less than 300 Å;
    one of the electrode of the photo-sensitive member being electrically coupled to one of the source and drain of the associated thin film switching transistor; and
    a video signal line coupled to one of each transistor and photo-sensitive member.

2. The solid state image sensor of claim 1, wherein the thin film of photo-sensitive material is amorphous silicon.

3. The solid state image sensor of claim 1, wherein the thin film of semiconductor material of each switching transistor is polycrystalline silicon.

4. The solid state image sensor of claim 1, wherein the thin film of photo-sensitive material is amorphous silicon and the thin film semiconductor material of each switching transistor is polycrystalline silicon 5. The solid state image sensor of claim 1, wherein the thin film photo-sensitive material is selected from the group consisting of Zn-Se, Cd-Te, Se-As-Te and Si.

6. The solid state image sensor of claim 1, wherein the insulating substrate is formed of glass.

7. The solid state image sensor of claim 1, wherein the drain region of the switching transistor is enlarged, an insulating layer is disposed over the enlarged drain region and the thin film of photo-sensitive material is disposed over the insulator, said photo-sensitive film and drain region functioning as a capacitor.

8. The solid state image sensor of claim 1, further including peripheral circuit means for scanning the gate of each switching transistors for selecting the sensing cells, said peripheral circuit means is a C-MOS circuit formed on the substrate by depositing a thin film semiconductor material on said substrate.

9. The solid state image sensor of claim 1, wherein the video signal line is coupled to each transistor.

10. The solid state image sensor of claim 1, wherein the video signal line is coupled to each photo-sensitive member.

11. The solid state image sensor of claim 1, wherein the photo-sensitive member includes a transistor having a source electrode, drain electrode and gate electrode, the gate electrode being electrically coupled to one of the source and drain electrodes forming the upper electrode region and the lower electrode region.

12. The solid state image sensor of claim 11, wherein the source-drain path of the transistor forming the photo-sensitive member is coupled in series with the source-drain path of the switching transistor.

13. The solid state image sensor of claim 11, wherein the switching transistor is turned on by a signal applied to its gate electrode causing a bias voltage to be applied to the photo-sensitive member placing the photo-sensitive member in a charged state.

14. The solid state image sensor of claim 13, wherein light contacting the charged photo-sensitive member causes the photo-sensitive member to discharge from its charged state when the switching transistor is turned off.

15. The solid state image sensor of claim 13, wherein the photo-sensitive member is recharged when the switching transistor is turned on after the photo-sensitive member has been exposed to light, the recharging current going to the video line and being detected as a video signal.

16. A solid state image sensor having a plurality of photo-sensitive sensing cells arranged in a line or matrix, comprising:
 a substrate having a plurality of photo-sensitive sensing cells arranged on the substrate;
 each sensing cell including a photo-sensitive member and a switching transistor electrically coupled thereto;
 each photo-sensitive member formed of a lower electrode on the substrate, a thin film of a photo-sensitive amorphous semiconductor material on the lower electrode and an upper electrode on the photo-sensitive film, said photo-sensitive material having high photo-current and having high impedance in the dark;
 each switching transistor associated with a photo-sensitive member being a thin film transistor formed by disposing a thin film of a polycrystalline semiconductor material on the substrate, said semiconductor material being selected to have high channel mobility and a low light absorption coefficient;
 one of the electrodes of the photo-sensitive member being electrically coupled to one of the source and drain of the associated thin film switching transistor; and
 a video signal line coupled to one of each transistor and photo-sensitive member, wherein the drain region of the switching transistor is enlarged, a first insulating layer is disposed over the enlarged drain region, a conductive layer is disposed over the first insulating layer, a second insulating layer is disposed on the conductive layer, and a thin film of photo-sensitive material is disposed on the second insulating layer, said conductive layer and drain region functioning as a capacitor.

17. A solid state image sensor having a plurality of photo-sensitive sensing cells arranged in a line or matrix, comprising:
 a substrate having a plurality of photo-sensitive sensing cells arranged on the substrate;
 each sensing cell including a photo-sensitive member and a switching transistor electrically coupled thereto;
 each photo-sensitive member is a transistor formed with a first photo-sensitive semiconductor thin film formed and patterned on the substrate into first source, first drain and first channel regions, a gate insulating layer disposed on the first thin film, a first gate electrode formed on top of the gate insulating layer so as to overlie the first channel region, the first channel region being the photo-sensitive element and the parasitic capacitance between the first gate electrode and one of the first drain and first source being used to store the photo-excited charges; and
 each switching transistor is formed on the substrate with said first photo-sensitive semi-conductor thin film formed and patterned into second source, drain and channel regions, one of the first source and drain regions being coupled to one of the second source and drain regions, said gate insulating layer formed to overlie at least the second channel region of the first semiconductor thin film, a second gate electrode on top of the gate insulating film so as to overlie the second channel region, and a light protection layer being formed above the second gate electrode so as to overlie the second channel region so that the switching transistor is insensitive to incident light.

18. The solid state image sensor of claim 17, and including a video signal line coupled to one of each switching transistor and photo-sensitive member.

* * * * *